(12) United States Patent
Carrico (10) Patent No.: US 8,493,240 B1
(45) Date of Patent: *Jul. 23, 2013

(54) SYSTEM AND METHOD TO AUTOMATICALLY CONFIGURE AN AIRCRAFT FOR AN OPERATIONAL FLIGHT PHASE

(75) Inventor: Matthew J. Carrico, Mount Vernon, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 486 days.

This patent is subject to a terminal disclaimer.

(21) Appl. No.: 12/821,335

(22) Filed: Jun. 23, 2010

Related U.S. Application Data

(63) Continuation-in-part of application No. 12/504,524, filed on Jul. 16, 2009, now Pat. No. 8,217,807.

(51) Int. Cl.
*G01C 21/00* (2006.01)
(52) U.S. Cl.
USPC ............ 340/971; 340/945; 340/951; 340/964
(58) Field of Classification Search
USPC .......... 340/971, 945, 951, 963, 964; 715/859, 715/860, 771, 772; 701/9, 14, 15, 16
See application file for complete search history.

(56) References Cited

U.S. PATENT DOCUMENTS

| | | | |
|---|---|---|---|
| 6,643,580 B1 * | 11/2003 | Naimer et al. | 701/467 |
| 6,816,780 B2 | 11/2004 | Naimer | |
| 6,892,118 B1 | 5/2005 | Feyereisen | |
| 7,191,406 B1 * | 3/2007 | Barber et al. | 715/771 |
| 7,272,491 B1 * | 9/2007 | Berard | 701/467 |
| 7,321,318 B2 * | 1/2008 | Crane et al. | 340/971 |
| 8,217,807 B1 * | 7/2012 | Carrico | 340/971 |

* cited by examiner

*Primary Examiner* — Toan N Pham
(74) *Attorney, Agent, or Firm* — Donna P. Suchy; Daniel M. Barbieri (57) ABSTRACT

An operational flight phase determination, indication and configuration system for an aircraft includes input/output circuitry for receiving an operational flight phase selector output signal, aircraft sensor signals, and on-board automation system output signals including configuration status information. A processor is coupled to the input/output circuitry. A flight phase data table is coupled to the processor. The flight phase data table includes a list of the defined operational flight phases for the aircraft. A flight phase transition rules set is coupled to the processor. The flight phase transition rules set includes flight rules for defining flight phase transitions. An aircraft system configuration data table is coupled to the processor. The aircraft system configuration data table includes a list of the defined configurations for each operational flight phase and the aircraft system configuration settings for each configuration. Program memory and working memory are coupled to the processor. The processor uses input from the input/output circuitry, the flight phase data table, the flight phase transition rules set, the program memory, the working memory, and the aircraft system configuration data table to provide an operational mode signal indicating the operational mode of the aircraft and a configuration command signal. A display indicator driver is coupled to the processor for providing display indicator driver signals to an operational flight phase indicator in accordance with the operational mode signal. Output drivers are coupled to the processor for providing configuration commands to aircraft systems in accordance with the configuration command signal.

15 Claims, 10 Drawing Sheets

| Transition To | Condition |
|---|---|
| Pre Flight | (Pilot Selects Pre-Flight) AND (aircraft on ground)<br>-OR-<br>(Cold Start) AND (aircraft on ground) AND (aircraft position on ramp area) AND (ground speed = zero) |
| Taxi-out | (Pilot selects Taxi-Out) AND (aircraft on ground)<br>-OR-<br>(Previous state = Pre-Flight OR De-Ice) AND (aircraft position on surface movement area) AND (not on takeoff runway) |
| Takeoff | (Pilot selects Take-off) OR (Pilot selects Take Off / Go Around)<br>-OR-<br>(Previous state = Taxi Out) AND (aircraft position on takeoff runway) |
| Climb out | (Pilot selects climb-out) AND (aircraft in air)<br>-OR-<br>(Previous state = Takeoff) AND (aircraft in-air) AND (altitude above 400 ft AGL) |
| Cruise | (Pilot selects Cruise) AND (aircraft in air)<br>-OR-<br>(Previous state = Climb out) AND (automation mode = cruise) |
| Descent | (Pilot selects Descent) AND (aircraft in air)<br>-OR-<br>(Previous state = Cruise) AND (automation mode = descent) |
| Approach | (Pilot selects Approach) AND (aircraft in air)<br>-OR-<br>(Previous state = Descent OR Missed Approach) AND (automation mode = Approach) |
| Landing | (Pilot selects Landing) AND (aircraft in air)<br>-OR-<br>(Previous state = Descent) AND (automation mode = landing) |
| Taxi-in | (Pilot selects Taxi-in) AND (aircraft on ground)<br>-OR-<br>(Previous state = Landing) AND (aircraft on surface movement area) AND (not on landing runway) |
| Post Flight | (Pilot selects Post Flight) AND (aircraft on ground)<br>-OR-<br>(Previous state = Taxiin) AND (aircraft on ground) AND (aircraft on ramp area) AND (groundspeed = zero) |
| Manual Override | Pilot selects Manual Override |
| Emergency | Pilot selects Emergency<br>-OR-<br>Automation mode is Emergency |
| De-ice | (Pilot selects De-Ice) and (aircraft on ground)<br>-OR-<br>(Previous state is Taxi-Out) AND (aircraft position on de-ice pad) AND (groundspeed = zero) |
| Missed Approach | (Pilot selects Missed Approach) AND (aircraft is in air)<br>-OR-<br>(Previous mode is Approach) AND (pilot selects TakeOff / Go Around)<br>-OR-<br>(Previous state is Approach) AND (automation mode is Missed Approach) |

| Configuration | Landing Lights | Transponder |
|---|---|---|
| Engine Off | Off | Off |
| Engine Start | Off | Off |
| Taxi | Off, except when on a runway, then On | Standby |
| Takeoff | On | On |
| Climb | Off | On |
| Cruise | Off | On |
| Descent | Off | On |
| Approach | Off | On |
| Landing | On | On |
| Manual Override | No command | No command |
| Emergency | No command | On, set to emergency code |
| De-ice | Off | Off |
| Missed Approach | On | On |

FIG. 9

| Flight Phase | Landing Lights | Transponder |
| --- | --- | --- |
| Pre Flight | Off | Standby |
| Taxi-out | Off, except when on a runway, then On | Standby |
| Takeoff | On | On |
| Climb out | Off | On |
| Cruise | Off | On |
| Descent | Off | On |
| Approach | Off | On |
| Landing | On | On |
| Taxi-in | Off, except when on a runway, then On | Standby |
| Post Flight | Off | Off |
| Manual Override | No command | No command |
| Emergency | No command | On, set to emergency code |
| De-ice | Off | Off |
| Missed Approach | On | On |

FIG. 10

SYSTEM AND METHOD TO AUTOMATICALLY CONFIGURE AN AIRCRAFT FOR AN OPERATIONAL FLIGHT PHASE

CROSS REFERENCE TO RELATED APPLICATIONS

This is a continuation-in-part of U.S. Ser. No. 12/504,524, entitled "Operational Flight Phase Determination and Indication System", filed Jul. 16, 2009.

BACKGROUND OF THE INVENTION

1. Field of the Invention

The present invention relates generally to systems for providing operational flight phase indications, configuring aircraft systems, and more particularly to a system for determining and indicating operational flight phase, and configuring the aircraft systems according to the operational flight phase utilizing aircraft sensors, airplane automation modes, operational flight phase data tables, aircraft systems configuration data tables and flight crew input.

2. Description of the Related Art

Some avionics functions are dependent on the aircraft's phase of flight. For example, on-board data load is disabled when the aircraft is in-air. A slightly more complex example is the on-board weather radar, which uses a variety of inputs to determine takeoff and landing mode in order to automatically enable the predictive windshear detection function.

Generally today's avionics functions do not determine operational flight phase, but rather determine equipment operating modes using one or more aircraft state inputs and pilot commands to drive pre-defined logic determined at design time. Such methods are not able to account for all the real-time conditions that affect flight phase determination and they are not able to account for the operational intent of the pilot. In addition, current implementations are often federated, meaning each function uses its own inputs and logic, which can lead to flight phase disagreement between systems.

The limitations of the current methods will be a hindrance to the introduction of new flight deck automation, which have increased dependency on the unambiguous and consistent determination of the operational flight phase. Examples of this are Automatic Dependent Surveillance—Broadcast (ADS-B) In applications such as Airport Surface Situation Awareness and the on-board decision aids needed in NextGen mid- and far-term concepts being defined by the Federal Aviation Administration.

Flight mode annunciator systems are commonly used with today's flight management and autoflight systems. These are based on various devices. For example, U.S. Pat. No. 6,892,118, issued to T. L. Feyereisen, entitled Pictographic Mode Awareness Display for Aircraft, discloses a device, method and computer program for generating and displaying graphical displays symbolic of current and available operational modes of instrument systems, such as navigation and autopilot systems. The Feyereisen method includes receiving a signal representative of a current mode of operation of one or more instrument systems, interpreting the current mode of operation signal to determine the current mode of operation, outputting a control signal informing a pictographic representation symbolic of the current mode of operation, and displaying the pictographic representation of the current mode of operation on a display device, such as a cockpit panel display.

An operational flight phase may be defined as the current operational purpose of the flight or ground segment, usually from the perspective of the pilot or operator. Typical operational phases, part of nearly every flight segment, are Pre-flight, Engine Taxi Out, Take-off, Climb-out, Cruise, Descent, Approach, Landing, Taxi-In, Engine Shut-Down, and Post-flight. Additional operational modes can be defined for emergency events or optional operational activities such as de-ice, return-to-service engine checks, ferry flights, etc. It is noted that these operational flight phases are distinct from the avionics system automation modes typically found in flight management systems and autopilot systems. Such systems may define modes such as "altitude hold" or "lateral navigation", however, these modes refer to the mode of the flight management or autopilot system, not the operational intent of the pilot. For example, an autopilot may be commanded by the pilot to a "heading hold" mode to keep the airplane on a pre-determined heading. The autopilot does not 'know' the operational intent of the heading hold mode, which could, for example, be to assist with following air traffic control vectors during final approach, or may be to follow a specific heading direction during cruise flight. As noted above, generally today's avionics functions do not determine the operational phase of flight, but rather they determine equipment mode using one or more aircraft state inputs and/or pilot inputs to drive pre-defined logic determined at design time. Such methods are not able to account for all the real-time conditions that affect flight phase determination. In addition, current implementations are often federated, meaning each function uses its own inputs and logic, which can lead to mode disagreement between systems.

Operator procedures are often based on the operational flight phase. For example, during Pre-flight the flight crew checks the operational status of aircraft systems and configures those systems for the intended operation. In many cases the operational flight phase determines how the aircraft systems are used. For example, when in the takeoff operational flight phase, the parking brake is not set while the engines are brought up to takeoff thrust. However, when performing a return-to-service engine check, the parking brake must be set while the engines are brought up to high thrust.

A deficiency in today's avionics systems is that the system modes as defined by the current state of the art do not take into account the operational flight phase and do not modify their operation based on the operational flight phase. This means the pilot must understand how the intended flight operation affects the overall system operation and command the avionics systems to the proper configuration.

This places a burden on the pilot to understand the objectives of the intended operational flight phase and configure the aircraft systems appropriately. This imposes additional workload on the pilot and in some cases has led to accidents such as unintentional aircraft movement during return-to-service engine checks.

The aforementioned prior art focuses on the modes of the on-board systems. Additionally, the prior art does not address the effect of the higher level operational flight phases on the on-board systems and the high workload placed on the pilot to properly configure the on-board systems appropriately for the intended operation.

Airplanes must be configured appropriately for the operational flight phase. For example, when taking off, the flight crew configures the flight surfaces (e.g., flaps), flight instruments, airplane systems, etc., for takeoff. This is usually accomplished by means of executing a flight phase-specific checklist to set and verify all the various on-board systems. Depending on the amount of automation available on the airplane, the length of the checklist, the number of items that must be configured, checked, and cross-checked can cause a significant amount of heads down time and an opportunity for errors. The lengthy heads down time contributes to workload and time away from the primary tasks of "aviate, navigate, and communicate". Configuration errors can lead to subsequent higher downstream workload to correct the problem, or, in the worst case, unsafe operating conditions

SUMMARY OF THE INVENTION

In a first broad aspect, the present invention is an operational flight phase determination, indication and configuration system for an aircraft. It includes input/output circuitry for receiving an operational flight phase selector output signal, aircraft sensor signals, and on-board automation system output signals including configuration status information. A processor is coupled to the input/output circuitry. A flight phase data table is coupled to the processor. The flight phase data table includes a list of the defined operational flight phases for the aircraft. A flight phase transition rules set is coupled to the processor. The flight phase transition rules set includes flight rules for defining flight phase transitions. An aircraft system configuration data table is coupled to the processor. The aircraft system configuration data table includes a list of the defined configurations for each operational flight phase and the aircraft system configuration settings for each said configuration. Program memory and working memory are coupled to the processor. The processor uses input from the input/output circuitry, the flight phase data table, the flight phase transition rules set, the program memory, the working memory, and the aircraft system configuration data table to provide an operational mode signal indicating the operational mode of the aircraft and a configuration command signal. A display indicator driver is coupled to the processor for providing display indicator driver signals to an operational flight phase indicator in accordance with the operational mode signal. Output drivers are coupled to the processor for providing configuration commands to aircraft systems in accordance with the configuration command signal.

In another broad aspect, the present invention is embodied as an aircraft configuration determination system that allows the pilot to configure the airplane in accordance with a predefined configuration selected from a list of available configurations. Input/output circuitry receives a configuration selector output signal; and, on-board automation system output signals including configuration status information. A processor is coupled to the input/output circuitry. An aircraft system configuration data table is coupled to the processor. The aircraft system configuration data table includes a list of the defined configurations for each configuration selectable by a configuration selector. Program memory and working memory are coupled to the processor. The processor uses input from the input/output circuitry, the program memory, the working memory and the aircraft system configuration data table to provide a configuration mode signal indicating the selected configuration mode of the aircraft and a configuration command signal. A display indicator driver is coupled to the processor for providing display indicator driver signals to a configuration indicator in accordance with the configuration mode signal. A plurality of output drivers are coupled to the processor for providing configuration commands to aircraft systems in accordance with the configuration command signal.

In another broad aspect, the present invention is embodied as a method for determining, indicating, and configuring an operational flight phase of an aircraft. In a first step of this method an operational flight phase selector output signal, aircraft sensor signals, and on-board automation system output signals including configuration status information are received, utilizing input/output circuitry. An operational mode signal is provided indicating the operational mode of the aircraft and a configuration command signal, using input from the input/output circuitry, a flight phase data table, a flight phase transition rules set, an aircraft system configuration data table, program memory and working memory. The flight phase data table includes a list of the defined operational flight phases for the aircraft. The flight phase transition rules set include flight rules for defining flight phase transitions. The aircraft system configuration data table includes a list of the defined configurations for each operational flight phase and the aircraft system configuration settings for each configuration.

Display indicator driver signals are generated in accordance with the operational mode signal. A plurality of output drivers coupled to the processor provide configuration commands to aircraft systems in accordance with the configuration command signal. The active operational flight phase of the aircraft is displayed in response to the display indicator driver signals. Aircraft systems are configured in response to the configuration command signal.

The operational flight phase determination, indication and configuration system of the present invention provides a solution to the lengthy heads down time and the possibility of a configuration error by automating the configuration process such that the aircraft auto-configures for the operational flight phase. Such automation reduces the time crew time required to configure the aircraft and also reduces the probability of an erroneous configuration by having the configuration settings pre-determined. When combined with a closed-loop checklist, such a system also reduces the amount of time needed to verify the configuration.

BRIEF DESCRIPTION OF THE DRAWINGS

The same elements or parts throughout the figures of the drawings are designated by the same reference characters, while equivalent elements bear a prime designation

DETAILED DESCRIPTION OF THE INVENTION

Figure 1:
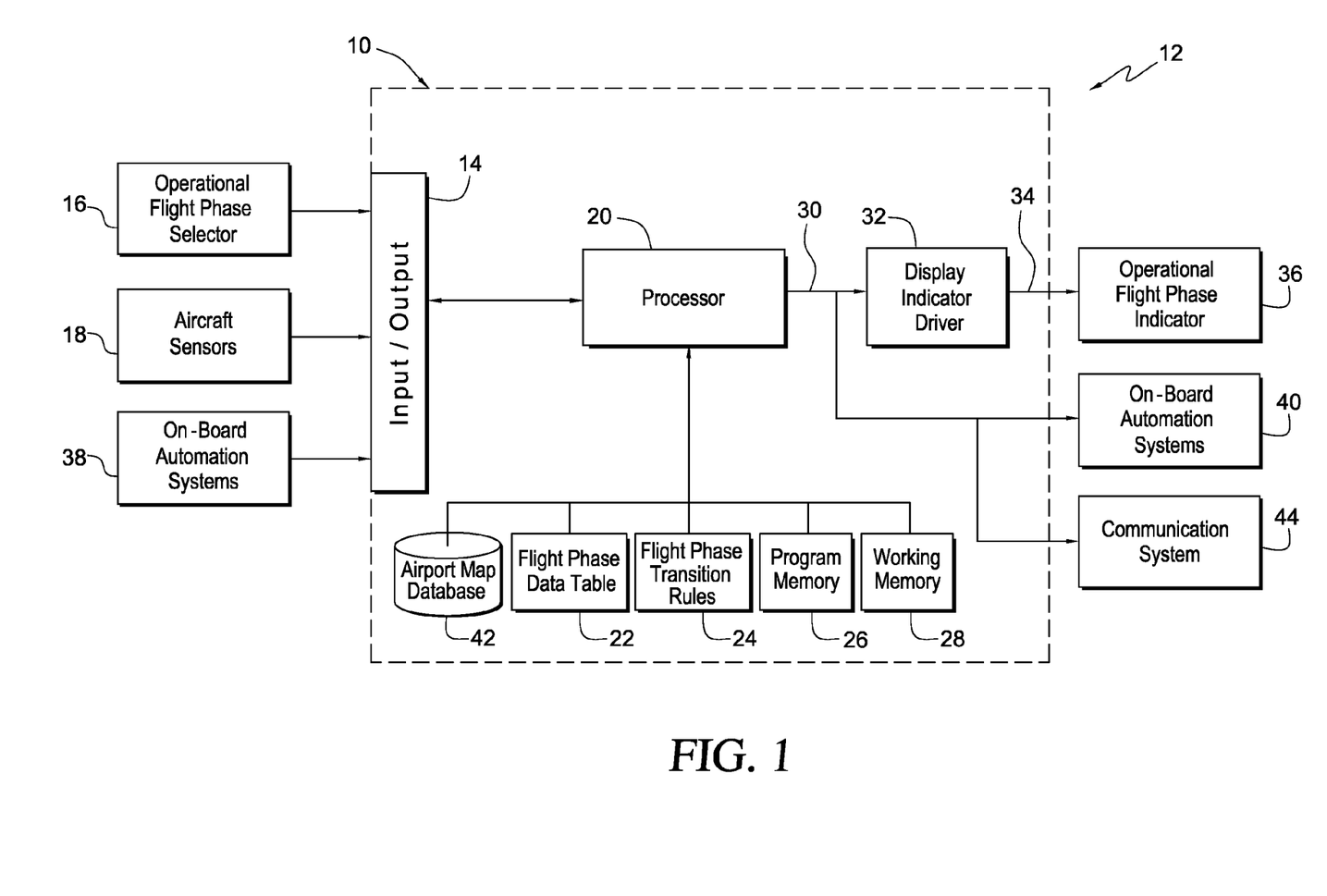
FIG. 1 is a block diagram of the operational flight phase determination and indication system of the present invention.

Referring now to the drawings and the characters of reference marked thereon, FIG. 1 illustrates a preferred embodiment of the operational flight phase determination and indication system of the present invention, designated generally as 10, in an aircraft environment, designated generally as 12. The operational flight phase determination and indication system 10 includes input/output circuitry 14 for receiving an operational flight phase selector output signal from an operational flight phase selector 16 and aircraft sensor signals from aircraft sensors 18. A processor 20 is coupled to the input/output circuitry 14. A flight phase data table 22 is coupled to the processor 20. The flight phase data table 22 includes a list of the defined operational flight phases for the aircraft. A flight phase transition rules set 24 is coupled to the processor 20. The flight phase transition rules set 24 includes flight rules for defining flight phase transitions. Program memory 26 and working memory 28 are coupled to the processor 20. The processor 20 uses input from the input/output circuitry 14, the flight phase data table 22, the flight phase transition rules set 24, the program memory 26 and the working memory 28 to provide an operational mode signal 30 indicating the operational mode of the aircraft. A display indicator driver 32 is coupled to the processor 20 for providing display indicator driver signals 34 to an operational flight phase indicator 36 in accordance with the operational mode signal 30.

The input/output circuitry 14 may be for example, interface circuitry conforming to ARINC 429 or ARINC 624 standards, which are well known in the avionics industry, or standard discrete input and output circuitry conforming to ARINC 700 series equipment standards, which are also well known in the avionics industry. The input/output circuitry 14 may receive data from and transmit data to the operational flight phase selector 16, aircraft sensors 18, and on-board automation systems 38 using a data format such as specified in the ARINC 429, ARINC 624, ARINC 700 series standards or the like.

The operational flight phase selector 16 may be, for example, a simple knob and select pushbutton integrated with a digital text display. The digital display may be the operational flight phase indicator 36 or may be a separate display integrated with the operational flight phase selector 16. Rotating the knob one position to the right or left sends a signal to the processor 20 to sequence to the next (if rotated right) or previous (if rotated left) flight phase available for selection. The processor 20 provides these available flight phases to the input/output circuitry 14 which provides a signal to display the available flight phase on the digital text display integrated with the operational flight phase selector 16. When the desired flight phase is displayed, pushing the integrated selector pushbutton sends a signal to the processor 20 via the input/output circuitry 14 indicating the selected flight phase. Alternatively, the operational flight phase selector may be implemented as a "soft" control using a menu on an interactive display screen, using a data format and user input devices such as specified in the ARINC 661, which is well known in the avionics industry for implementing menu-based user controls.

The aircraft sensors 18 may be, for example, discrete sensors such as strut switches, etc., used to indicate, for example, weight-on-wheels or door closure status, or aircraft navigation sensors such as defined in ARINC 743A-4, ARINC 755-3, and ARINC 706, which are well known sensor equipment standards in the aviation industry.

The processor 20 is a central processing unit (CPU) which may comprise a general purpose aviation computing platform such as described in RTCA DO-255, which is well known in the aviation industry, or a microprocessor such as a PowerPC microprocessor manufactured by International Business Machines Corporation. The CPU of the system 20 may also comprise associated support circuitry as is known in the art.

The flight phase data table 22 which is coupled to the processor 20 is an essential element of the present system. The flight phase data table includes a list of the defined, allowable, operational flight phases for the aircraft. The flight phase categories are ones that the airplane manufacturer and perhaps the operator would like to determine. The flight phase data tables may include for example, the following operational phases: Pre-flight, Push back, Engine start, Ramp taxi out, Taxi out, De-ice, Take off, Climb, Cruise, Descent, Approach, Missed Approach, Landing, Rollout, Taxi off, Taxi in, Ramp taxi in, Engine shutdown, and Post flight. Additional flight phases may be defined for other operations such as Return to service engine check and/or abnormal operations such as Emergency or for pilot override of the flight phase selector such as Manual Override.

The program memory 26 coupled to the processor 20 includes the program instructions for implementing the algorithm for determining the current flight phase from the input/output circuitry 14, the flight phase data table 22, and the flight phase transition rule set 24. The working memory 28 is random access memory (RAM).

The logic for implementing the flight phase determination system may be implemented in a special purpose device, or may be in the form of a stored program executable by a general purpose or special purpose computer. Preferably, the flight phase determination is configured as a general purpose computer system which may be integrated with systems that perform other functions.

Preferably, the input/output circuitry receives aircraft sensor information from the aircraft sensors 18, on-board automation system output signals from on-board automation systems 38, and pilot selected flight phase from the operational flight phase selector 16 for use in determining the flight phase and flight phase transitions. On-board automation systems 38 may be, for example, flight management systems as defined in ARINC 702, an autopilot system, or the like. The processor 20 preferably provides the operational mode signal 30 to the display indicator driver 32 which drives the operational flight phase indicator 36 to indicate the flight phase to the crew. The operational mode signal 30 may also provide the flight phase information to on-board automation systems 40 for use by the on-board automation systems.

The system 10 of the present invention preferably includes an airport map database 42 coupled to the processor which is used to infer the operational phase that the aircraft is in when the airplane is on the ground. The system 10 uses the aircraft sensors 18 to procure current airplane location in terms of latitude/longitude information. The processor 20 compares the latitude/longitude information to the airport map information from database 42. Correlation of the aircraft position with the airport map information can determine, for example, that the aircraft is at a runway, a taxiway, a ramp area, or de-icing pad. Therefore, the system 10 can infer from where the airplane is at and other conditions the operational phase that the aircraft is in. Use of the airport map database is optional. If it is not used the flight phase transition rules 24 give stronger weight to the signals that the system 10 does have and stronger weight to the flight crew input.

The operational mode signal may provide one or more operational modes defined by the user. User defined operational modes are contained in the flight phase database 22 and the rules for transitioning to and from the user defined operational modes are contained in the flight phase transition rules 24 and processed in the processor 20.

Optionally, the operational mode signal 30 may be provided to a communication system 44. The communication system may be a VHF, HF, SATCOM or other data link radio as commonly used in the aviation industry for communicating information to air traffic control, flight operations centers, maintenance operations, other aircraft, or other external entities. Although not specifically shown in this figure, a communication system can provide communication system output signals for use in determining the flight phase and flight phase transitions.

Figure 2:
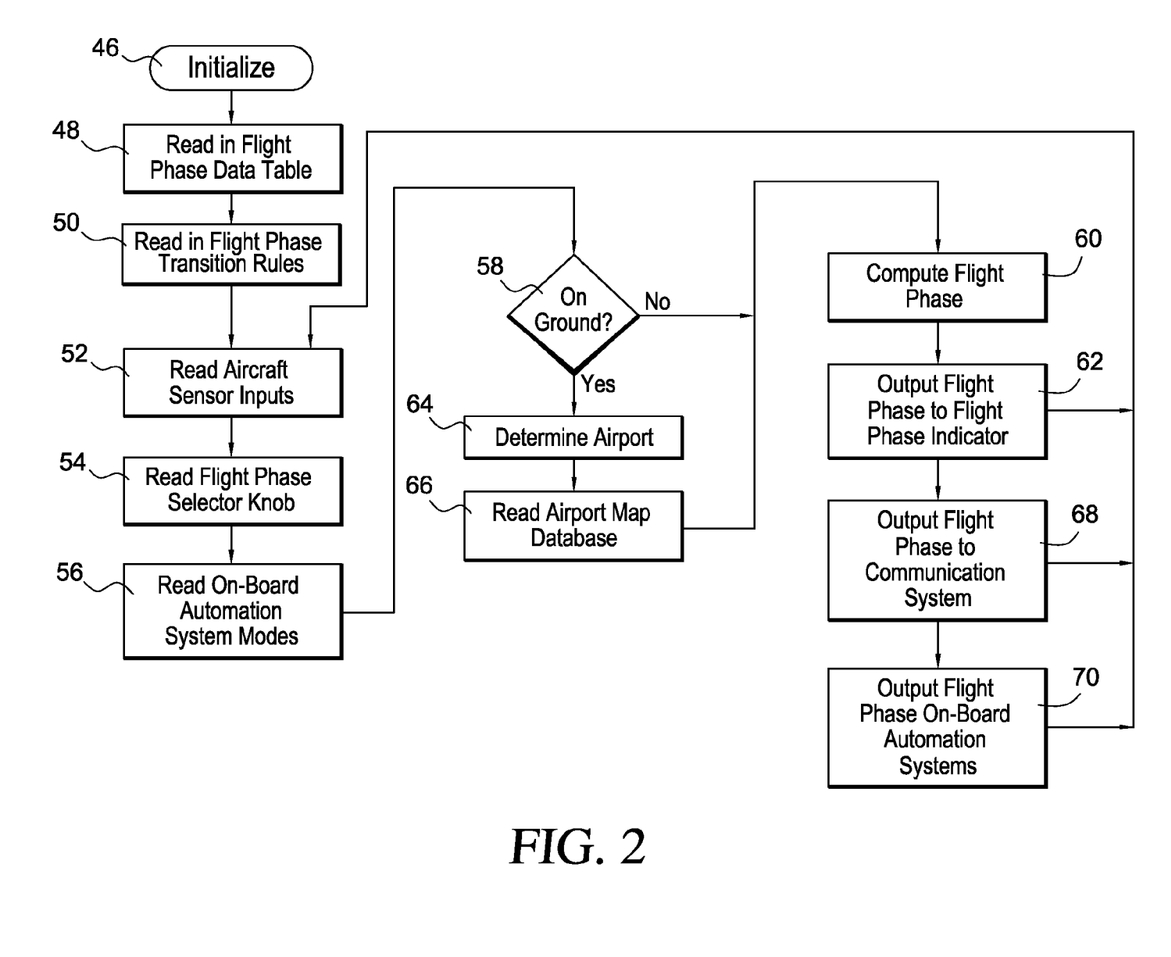
FIG. 2 is a flow diagram showing the processor implementation steps of the operational flight phase determination and indication system.

Referring now to FIG. 2, an example implementation of the algorithm for processor 20 operation is as follows:

The processor 20 is first initialized, as shown by process step 46. It then reads in the flight phase data table (process block 48). The flight phase transition rules table is then read (process block 50). The aircraft sensor signals are read (process block 52). The operational flight phase selector output signal is read (process block 54). On-board automation system output signals from on-board automation systems are read (process block 56). If the airport map database 42 feature is utilized, the processor determines whether the aircraft is on the ground based on the cumulative effects of the previous steps (determining step 58). If the aircraft is not on the ground, the flight phase is computed (process block 60) and the operational mode signal is presented to the flight phase indicator (process block 62). The steps described above beginning with process block 52 are then repeated.

If the aircraft is on the ground, in a preferred embodiment, the processor determines the airport (process block 64) and the airport map database information is read (process block 66).

With other optional features the processor further operates to implement a step of providing the operational mode signal to a communication system (process block 68) and/or providing the operational mode signal to on-board automation systems (process block 70). The communication system (process block 68) provides the operational mode to external users such air traffic control, flight operations centers, and maintenance centers for purposes such as tracking the progress of the flight. The on-board automation (process block 70) can use the operational mode to configure the appropriate system modes for the operational phase.

Figure 3:
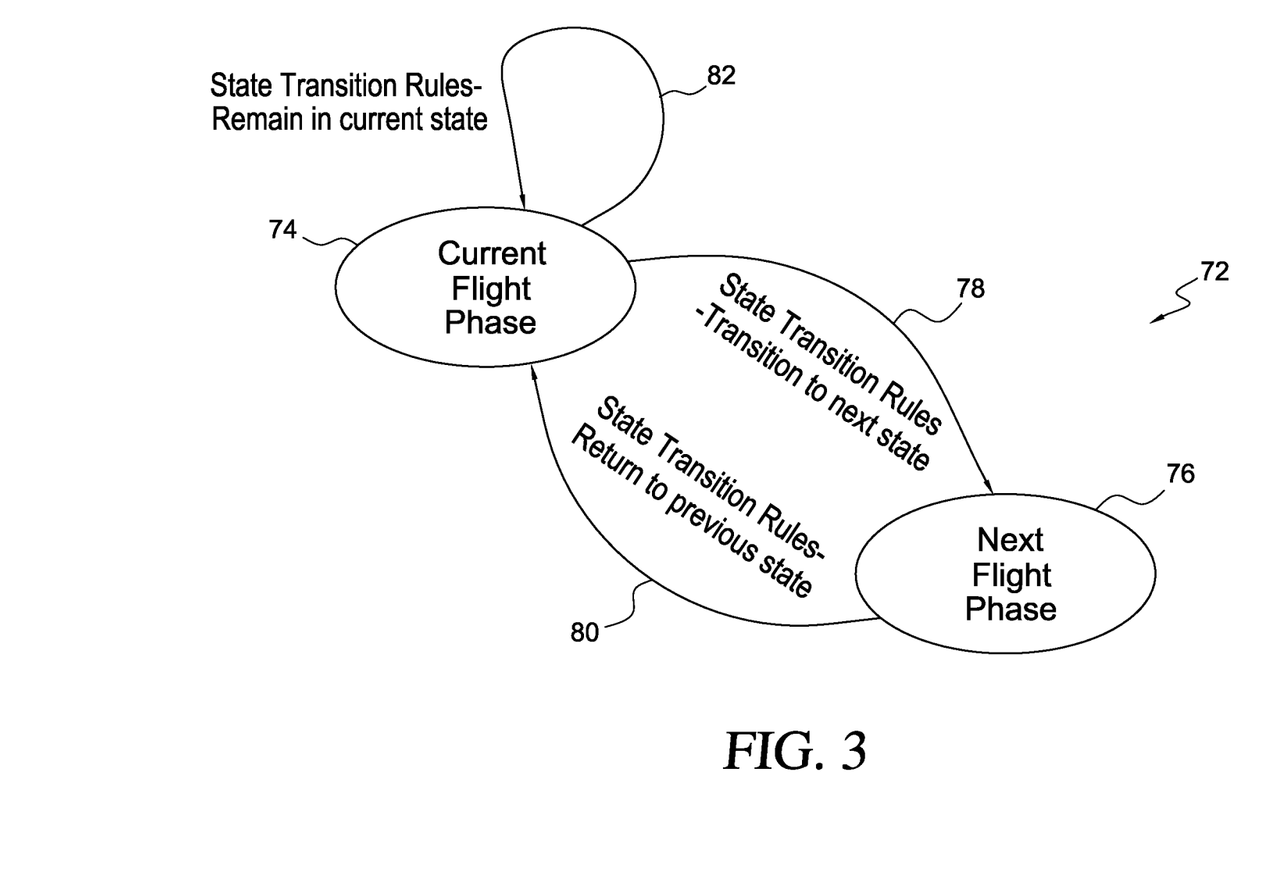
FIG. 3 is a state diagram illustrating the method of computing the flight phase.

Referring now to FIG. 3, the method of computing the flight phase is illustrated, designated generally as 72. In this Figure, the "bubbles" indicate states and the arrows indicate state transitions. While in the present flight phase, as indicated by bubble 74, in order to transition to the next flight phase 76, as indicated by arrow 78, certain conditions must be met, as defined by the state transition rules. This is based on the combination of aircraft inputs and flight phase selector outputs. When the conditions become "true", the system provides an indication that the aircraft is no longer in the current flight phase, there has been a transition to the next flight phase. The next flight phase will either continue to transition to the next one in sequence, or it might return to the current phase, as indicated by arrow 80. It is also possible that the current flight phase will not transition at all, as indicated by arrow 82. In this instance, the criterion for transitioning has not been met. For example, if the airplane is in the pre-flight phase, the next logical state might be engine start. A set of state transition rules are defined that provide the conditions, based on aircraft input and flight phase selector inputs. Additionally, other rules, such as illegal transitions and transitions in which the aircraft can jump a state, can be defined. The flight phase transition rules set may be user defined. The flight phase transition rules may be provided in the form of a table 22, in a preferred embodiment, or as computer instructions contained in program memory 26.

Figure 4:
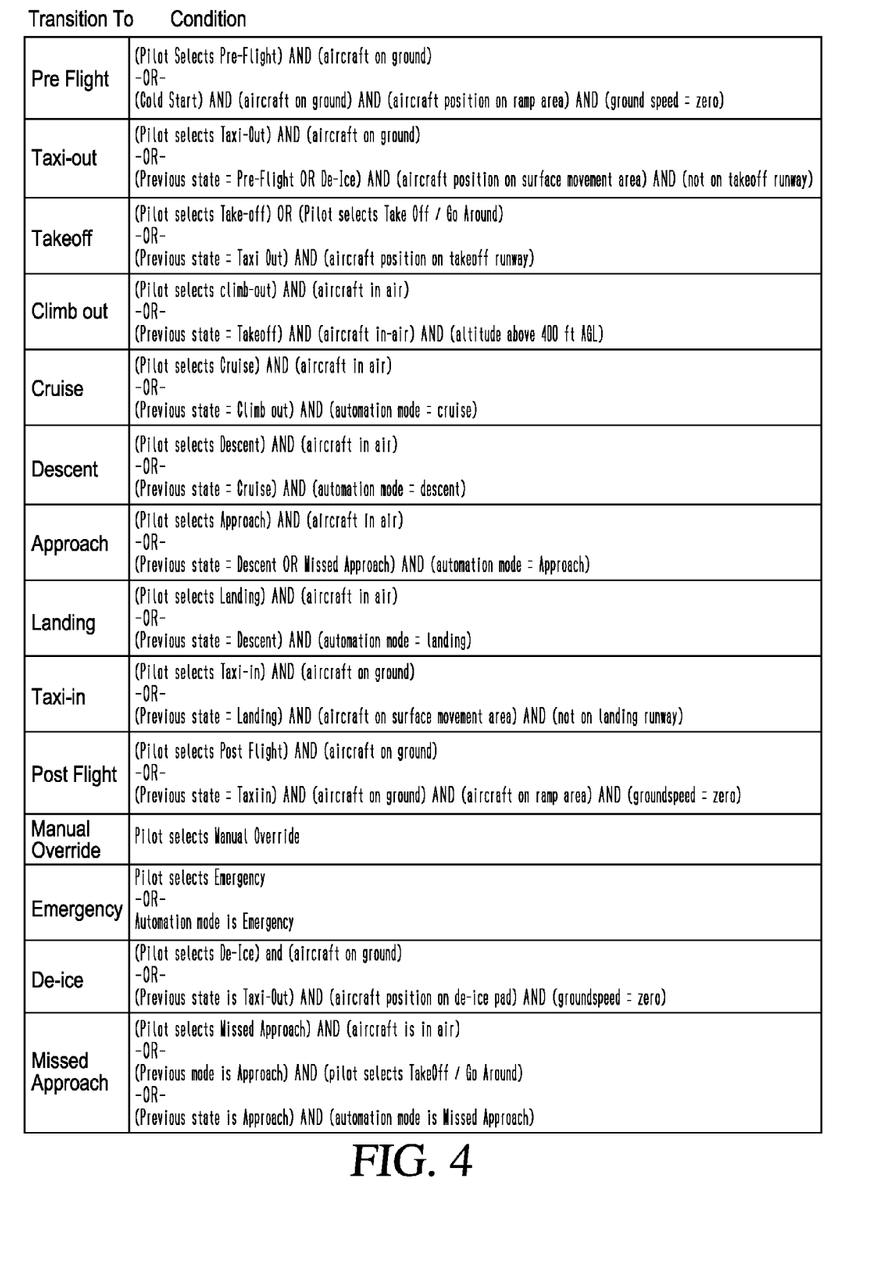
FIG. 4 is a table illustrating an example set of flight phase transition rules.
Figure 5:
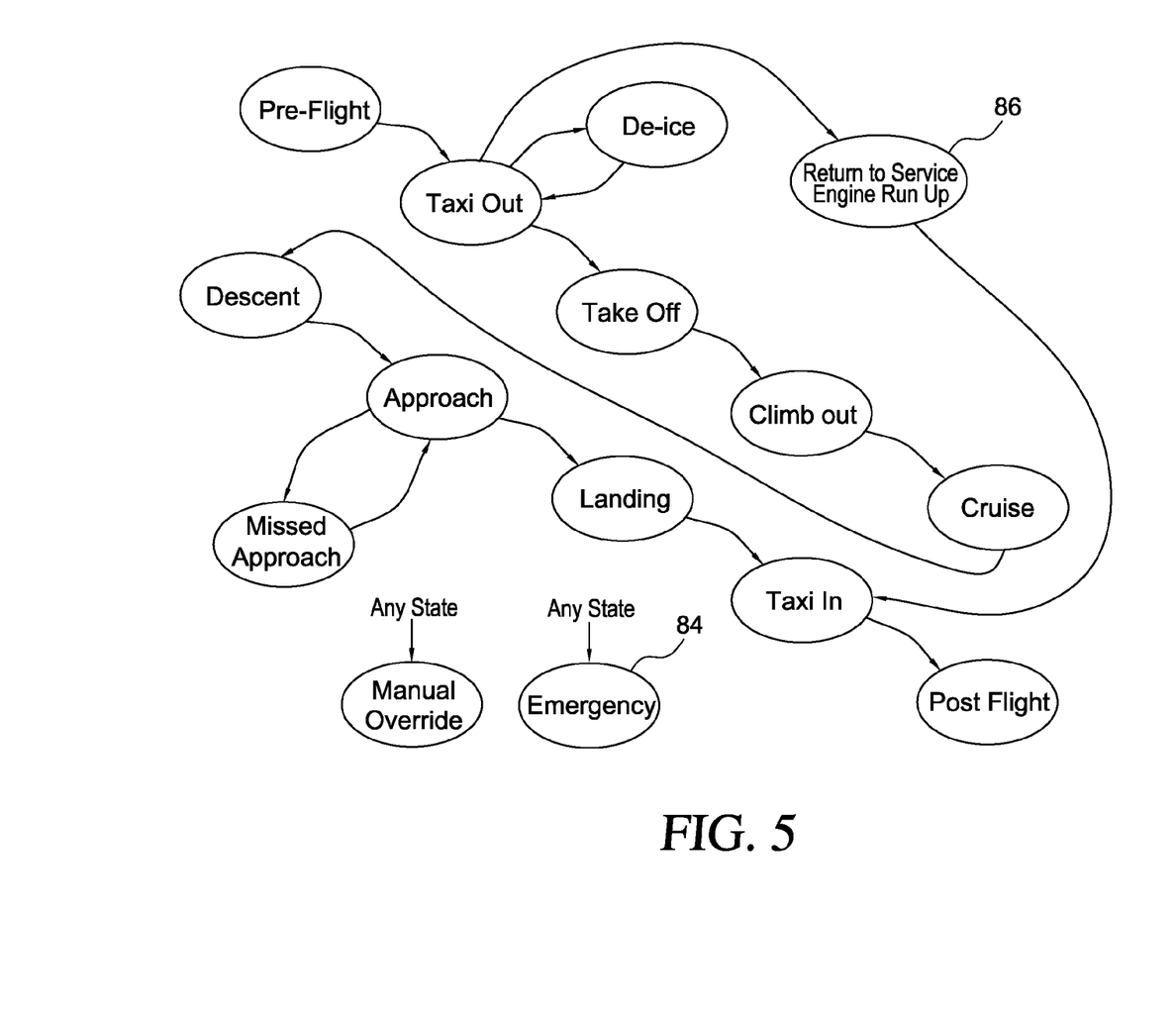
FIG. 5 is a flow diagram illustrating an example set of flight phase state transitions.

Referring now to FIGS. 4 and 5, the method of applying the flight phase transition rules (FIG. 4) to a particular set of operational flight phases (FIG. 5) is illustrated. FIG. 4 defines the flight phase transition rules in the preferred embodiment of a table and using well known logical equations as shown in the right hand column in the table of FIG. 4 to define the states and state transitions. FIG. 5 illustrates the states and allowable state transitions using the form of a state transition diagram, which is well known in the software programming industry. FIG. 5 includes the preferred embodiment of including user-defined states such as Emergency (numeral designation 84) and Return To Service Engine Run-up (numeral designation 86).

The operational flight phase determination and indication system implements the step of computing the flight phase by first obtaining the list of defined operational flight phases from the flight phase data table, next obtaining the flight rules from the flight phase transition rules set and determining whether a flight phase transition is occurring, by obtaining aircraft sensor signals, said operational flight phase selector output signal, and on-board automation system output signals as inputs from the input/output circuitry. The processor then determines the initial operational state by the applying the flight rules based on the current inputs and providing the determined flight phase mode the flight phase indicator, on-board automation, and communication system. The processor continues to monitor the inputs and transitions to the next operational state when the transition rules are satisfied by the inputs.

The solution is not intended to replace the current flight mode annunciator or other avionics or utilities functions that have a need for very specific logic for domain-specific functions (e.g., the aforementioned predictive windshear function, or the like).

The flight mode state transition table will determine allowable state transitions. Some mode determination and transitions will be entirely automatic and indicated to the flight crew for confirmation, while other modes may require crew selection. Conflicts between the inputs, state determination logic, and the state transition table will be indicated to the flight crew for resolution.

The direct involvement of the flight crew is a unique element of this solution. The benefits of this solution are twofold: the avionics systems have a common indication of the current flight phase and the crew has better mode control and awareness of the on-board automation, with the ability to override the automation if necessary.

In contrast to the flight mode annunciator commonly used with current flight management and autoflight systems, with the present invention the flight phase determination function is intended to indicate the operational mode of the aircraft, not the mode of the avionics. The present invention uses a combination of aircraft sensors and direct input from the pilot using a selector/indicator to determine the operational flight phase.

Figure 6:
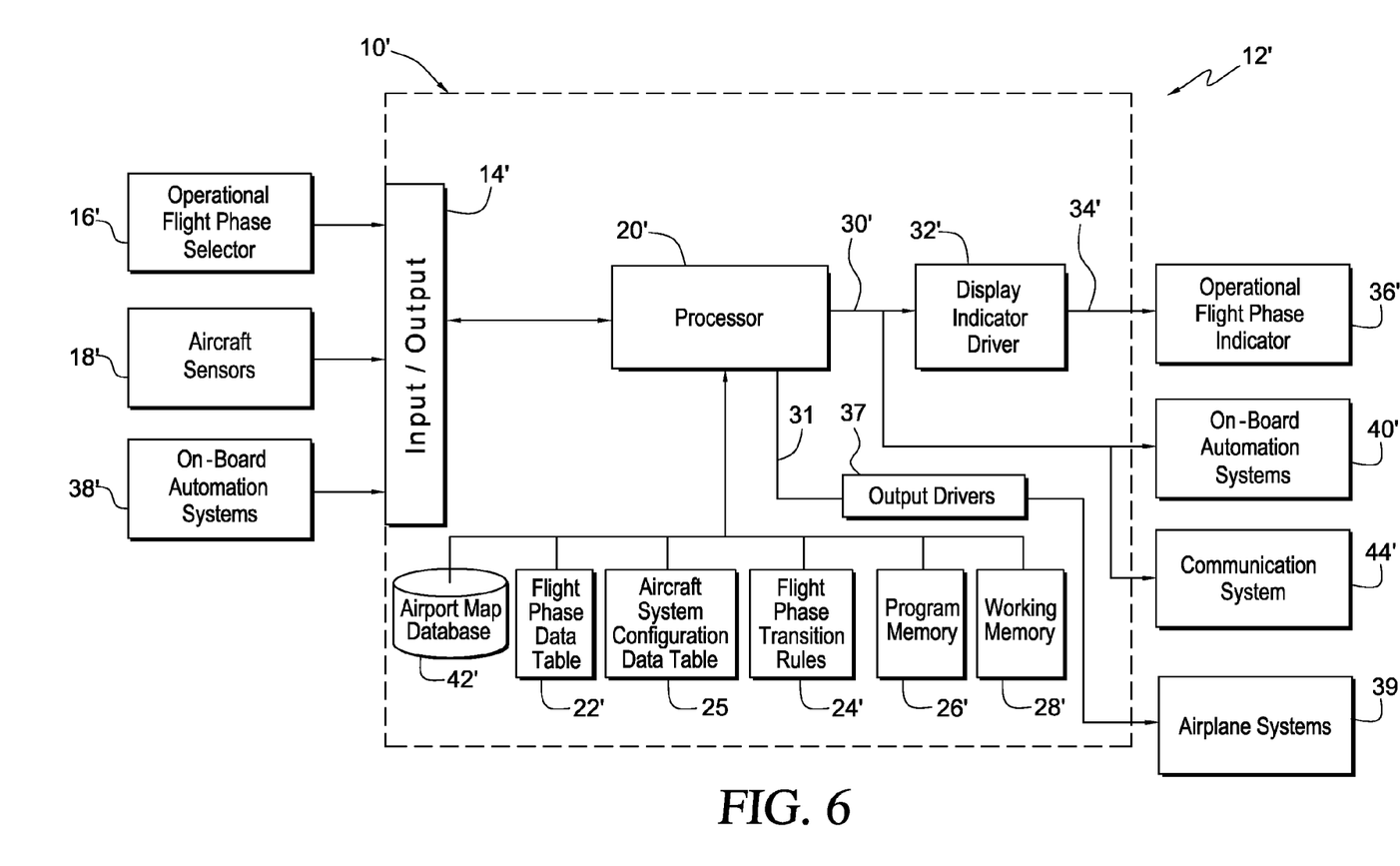
FIG. 6 is a block diagram of the operational flight phase determination, indication and configuration system of the present invention.

Referring now to FIG. 6, the present invention is shown embodied as an operational flight phase determination, indication and configuration system, designated generally as 10', in an aircraft environment, designated generally as 12'. System 10' includes input/output circuitry 14' for receiving an operational flight phase selector output signal from an operational flight phase selector 16', aircraft sensor signals from aircraft sensors 18', and on-board automation system output signals including configuration status information from the on-board automation systems 38'.

A processor 20' is coupled to the input/output circuitry 14'. A flight phase data table 22' is coupled to the processor 20'. The flight phase data table 22' includes a list of the defined operational flight phases for the aircraft. A flight phase transition rules set 24' is coupled to the processor 20'. The flight phase transition rules set 24' includes flight rules for defining flight phase transitions.

An aircraft system configuration data table 25 is coupled to the processor 20'. The aircraft system configuration data table 25 includes a list of the defined configurations for each operational flight phase and the aircraft system configuration settings for each configuration.

Program memory 26' and working memory 28' are coupled to the processor 20'. The processor 20' uses input from the input/output circuitry 14', the flight phase data table 22', the flight phase transition rules set 24', the program memory 26', the working memory 28', and the aircraft system configuration data table 25 to provide an operational mode signal 30' indicating the operational mode of the aircraft and a configuration command signal 31.

A display indicator driver 32' is coupled to the processor 20' for providing display indicator driver signals 34' to an operational flight phase indicator 36' in accordance with the operational mode signal 30'.

A plurality of output drivers 37 are coupled to the processor 20' for providing configuration commands to aircraft systems 39 in accordance with the configuration command signal 31. The configuration commands are implemented according to the interface requirements of the airplane systems being commanded. The output drivers circuitry 37 may be for example, interface circuitry conforming to ARINC 429 or ARINC 624 standards, which are well known in the avionics industry, or standard discrete output circuitry conforming to ARINC 700 series equipment standards, which are also well known in the avionics industry. In some cases, the output drivers may be implemented externally to the system 10 using remote data concentrators as are well known in the avionics industry. Some aircraft systems 39 may require configuration commands using unique electrical characteristics not conforming to the above mentioned standards, but which can be implemented using electrical interface design practices well known in the avionics industry.

As in the previous embodiment, the input/output circuitry 14' may be for example, interface circuitry conforming to ARINC 429 or ARINC 624 standards, which are well known in the avionics industry, or standard discrete input and output circuitry conforming to ARINC 700 series equipment standards, which are also well known in the avionics industry. The input/output circuitry 14' may receive data from and transmit data to the operational flight phase selector 16', aircraft sensors 18, and on-board automation systems 38' using a data format such as specified in the ARINC 429, ARINC 624, ARINC 700 series standards or the like.

The operational flight phase selector 16', aircraft sensors 18', processor 20', flight phase data table 22', program memory 26', flight phase data table 22', flight phase transition rule set 24', and working memory 28' may be as discussed above with respect to the previous embodiment.

Figure 7:
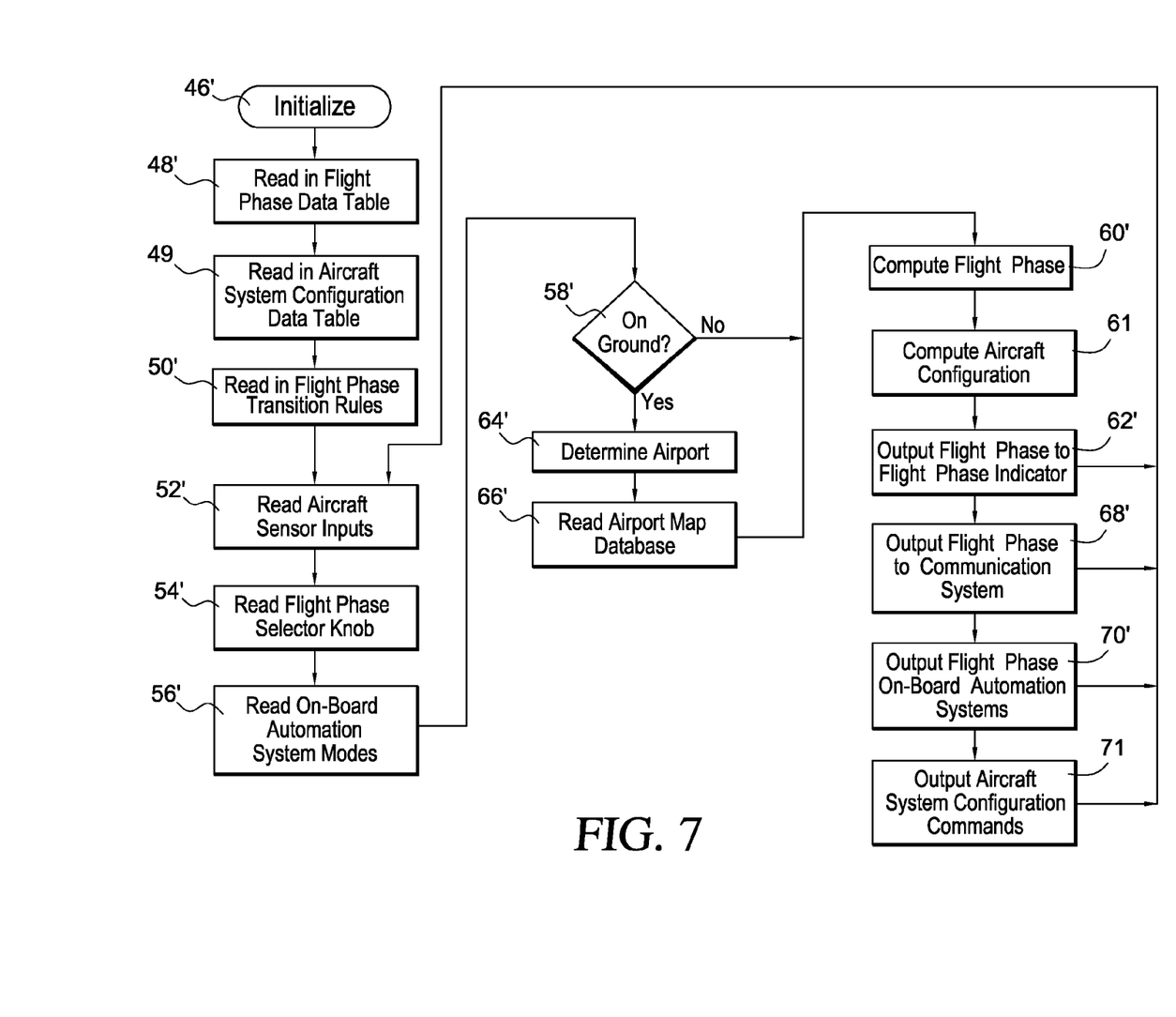
FIG. 7 is a flow diagram showing the processor implementation steps of the operational flight phase determination, indication and configuration system of the present invention.

Referring now to FIG. 7, an example implementation of the algorithm for processor 20' operation is as follows:

The processor 20' is first initialized, as shown by process step 46'. It then reads in the flight phase data table (process block 48'). The aircraft system configuration data table is then read in (process block 49). The flight phase transition rules table is then read (process block 50'). The aircraft sensor signals are read (process block 52'). The operational flight phase selector output signal is read (process block 54'). On-board automation system output signals from on-board automation systems are read (process block 56'). If the airport map database 42' feature is utilized, the processor determines whether the aircraft is on the ground based on the cumulative effects of the previous steps (determining step 58'). If the aircraft is not on the ground, the flight phase is computed (process block 60'), thus providing operational mode signal. The aircraft configuration is computed from the read aircraft system configuration data table, the read on-board automation system output signals, and the operational mode signal, thus providing a configuration command signal (process block 61). The operational mode signal is presented to the flight phase indicator (process block 62').

The processor further operates to implement a step of providing the operational mode signal to a communication system (process block 68') or providing the operational mode signal to on-board automation systems (process block 70'). The communication system (process block 68') provides the operational mode to external users such air traffic control, flight operations centers, and maintenance centers for purposes such as tracking the progress of the flight. The on-board automation (process block 70') can use the operational mode to determine the appropriate automation modes for the operational phase. Finally, the processor operates to implement a step of providing the configuration command signal to an aircraft system (process block 71).

Preferably, the aircraft sensor signals and the on-board automation system output signals are used to confirm that the aircraft system is properly configured in accordance with the configuration command signal 31.

The steps described above beginning with process block 52' are then repeated.

If the aircraft is on the ground, in a preferred embodiment, the processor determines the airport (process block 64) and the airport map database information is read (process block 66).

The above discussion regarding FIG. 3, applies equally with respect to this embodiment.

Figure 8:
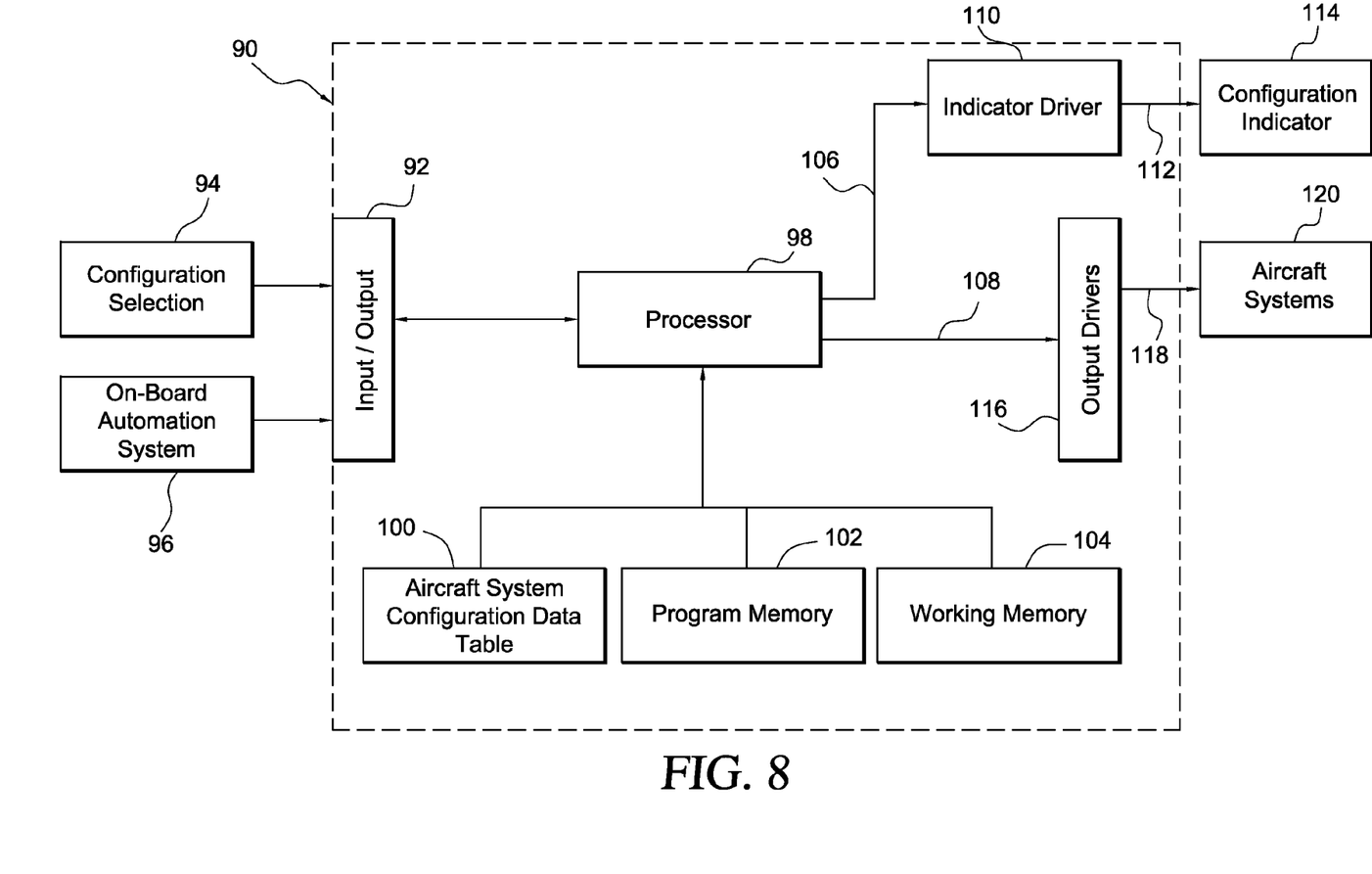
FIG. 8 is a block diagram of another embodiment of the present invention, implemented as a manually selectable aircraft configuration determination system.

Referring now to FIG. 8, another embodiment of the present invention is illustrated, as implemented as a manually selectable aircraft configuration determination system, designated generally as 90. Input/output circuitry 92 receives a configuration selector output signal from a configuration selector 94; and, on-board automation system output signals from an on-board automation system 96, including configuration status information. A processor 98 is coupled to the input/output circuitry 92. An aircraft system configuration data table 100 is coupled to the processor 98. The aircraft system configuration data table 100 includes a list of the defined configurations for each configuration selectable by the configuration selector 94. Program memory 102 and working memory 104 are coupled to the processor 98. The processor 98 uses input from the input/output circuitry 92, the program memory 102, the working memory 104 and the aircraft system configuration data table 100 to provide a configuration mode signal 106 indicating the selected configuration mode of the aircraft; and, a configuration command signal 108. A display indicator driver 110 is coupled to the processor 98 for providing display indicator driver signals 112 to a configuration indicator 114 in accordance with the configuration mode signal 106. A plurality of output drivers 116 are coupled to the processor 98 for providing configuration commands 118 to aircraft systems 120 in accordance with the configuration command signal 108.

Figure 9:
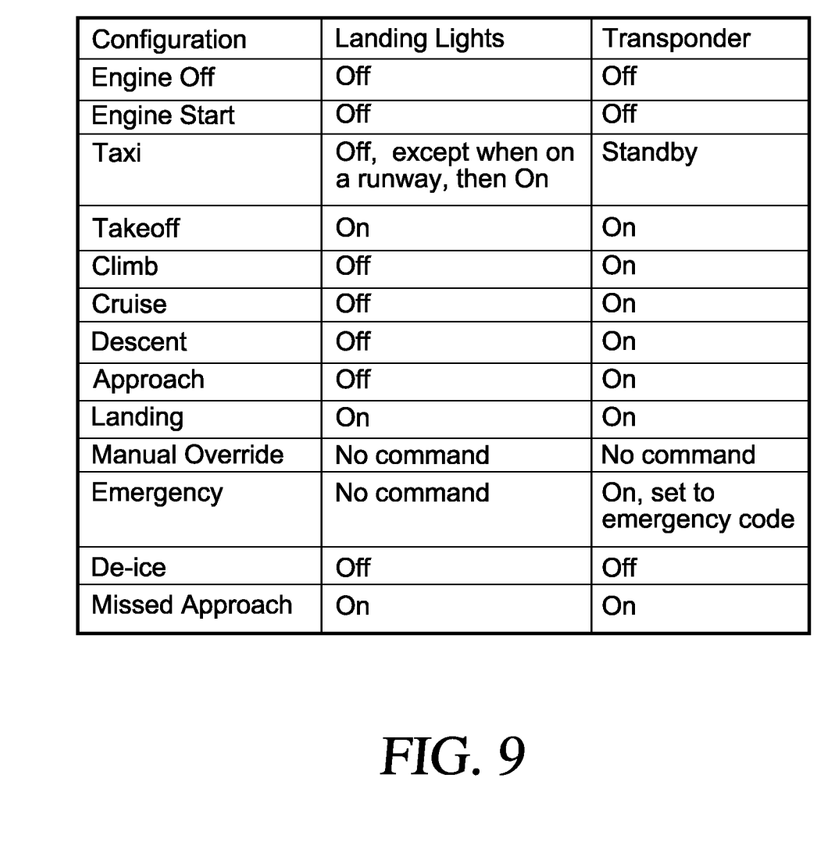
FIG. 9 is an Aircraft System Configuration Data Table illustrating various configurations and correlated aircraft system dispositions, used when implemented as a manually selectable aircraft configuration determination system of the FIG. 8 embodiment.

Referring now to FIG. 9, the method of applying a particular set of configurations (leftmost column of FIG. 9) to a particular set of aircraft systems (middle and right most columns) is illustrated as applied to the embodiment shown in FIG. 8. FIG. 9 defines the Aircraft System Configuration Data Table in the preferred embodiment of a table and using well known logical equations and aircraft system settings to define the configuration settings. FIG. 9 is intended to illustrate one embodiment of the Aircraft System Configuration Data Table for a certain set of configurations, aircraft systems, and aircraft system settings. Other forms of the data table may be used and other configurations, aircraft systems, and aircraft system settings are possible.

Thus, in the manual operational concept the crew is provided with a configuration selector which enables them to manually select the desired aircraft configuration from among a pre-determined list of available configurations. Once selected, the automation configures the aircraft accordingly, preferably confirms the configuration via the configuration status information from the aircraft sensors and on-board automation system outputs, and reports the results back to the crew.

In the embodiment of FIG. 6 the configuration selection is driven by the automatic flight phase determination system. In this concept, the flight phase determination system automatically determines the appropriate airplane configuration for the current (and next) flight phases, presents the auto-determined operational flight phase to the crew for confirmation; and, upon crew confirmation, automatically configures the aircraft as described above.

Suitable system automation may not be available on all aircraft platforms to respond to all the configuration commands. Aircraft with only partial system automation can be addressed with a combination of this invention for the automated systems and conventional manual means for the non-automated systems. One means to implement such a combined system is to automatically configure those aircraft systems that are capable of responding to the configuration command signals using the methods previously described herein. For those aircraft systems not capable of responding to the configuration command signals, a list of the aircraft systems and the corresponding system settings could be provided to the pilot using, for example, the configuration indicator 114 shown in FIG. 8. The pilot would then use the list to manually configure those aircraft systems. This manual configuration method could also apply to the embodiment of Figure 6.

Figure 10:
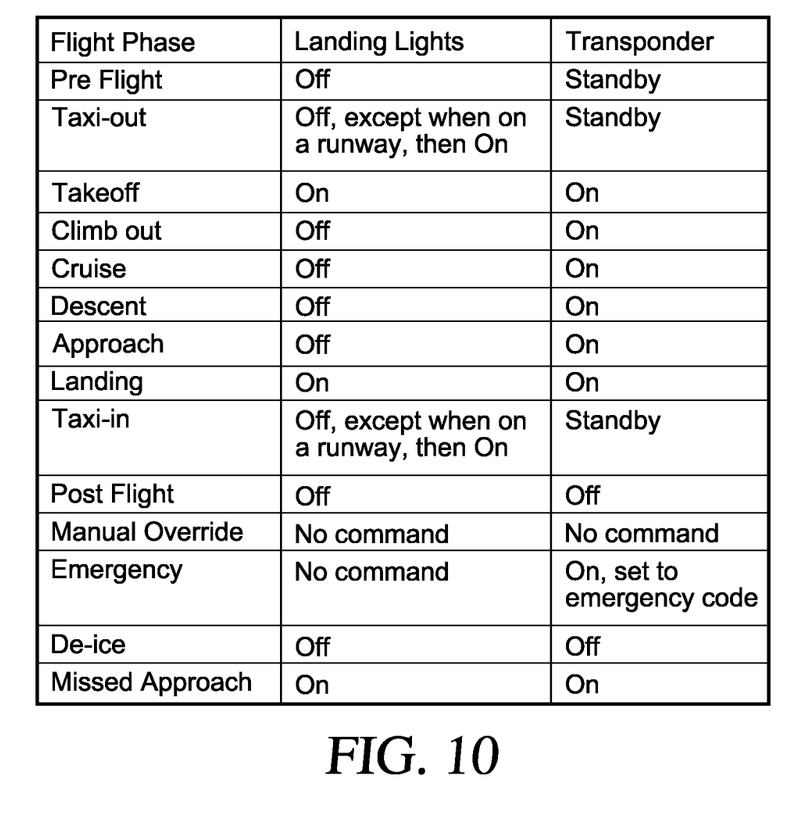
FIG. 10 is an Aircraft System Configuration Data Table illustrating various aircraft operational flight phases and correlated aircraft system dispositions used when implemented as an operational flight phase determination, indication and configuration system of the FIG. 6 embodiment.

Referring now to FIG. 10, the method of applying a particular set of operational flight phases (leftmost column of FIG. 10) to a particular set of aircraft systems (middle and right most columns) is illustrated as applied to the embodiment shown in FIG. 6. FIG. 10 defines the Aircraft System Configuration Data Table in the preferred embodiment of a table and using well known logical equations and aircraft system settings to define the configuration settings. FIG. 10 illustrates the one embodiment of the Aircraft System Configuration Data Table for a certain set of configurations, aircraft systems, and aircraft system settings. Other forms of the data table may be used and other configurations, aircraft systems, and aircraft system settings are possible.

Other embodiments and configurations may be devised without departing from the spirit of the invention and the scope of the appended claims.

The invention claimed is:

1. An operational flight phase determination, indication and configuration system for an aircraft, comprising:
   a) input/output circuitry for receiving an operational flight phase selector output signal, aircraft sensor signals, and on-board automation system output signals including configuration status information;
   b) a processor coupled to said input/output circuitry;
   c) a flight phase data table coupled to said processor, said flight phase data table including a list of the defined operational flight phases for the aircraft;
   d) a flight phase transition rules set coupled to said processor, said flight phase transition rules set including flight rules for defining flight phase transitions;
   e) an aircraft system configuration data table coupled to said processor, said aircraft system configuration data table including a list of the defined configurations for each operational flight phase and the aircraft system configuration settings for each said configuration;
   f) program memory and working memory coupled to said processor, wherein said processor uses input from said input/output circuitry, said flight phase data table, said flight phase transition rules set, said program memory, said working memory and said aircraft system configuration data table to provide an operational mode signal indicating the operational mode of the aircraft and a configuration command signal;
   g) a display indicator driver coupled to said processor for providing display indicator driver signals to an operational flight phase indicator in accordance with said operational mode signal; and,
   h) a plurality of output drivers coupled to said processor for providing configuration commands to aircraft systems in accordance with said configuration command signal.

2. The operational flight phase determination, indication and configuration system of claim 1 further comprising an airport map database coupled to said processor, airport map database information being used to infer the operational phase that the aircraft is in when the airplane is on the ground.

3. The operational flight phase determination, indication and configuration system of claim 1 wherein said operational mode signal provides an operational mode selected from the group of aircraft modes consisting of: Pre-flight, Push back, Engine start, Ramp taxi out, Taxi out, De-ice, Take off, Climb, Cruise, Descent, Approach, Missed Approach, Landing, Rollout, Taxi off, Taxi in, Ramp taxi in, Engine shutdown, Post flight, Emergency, and Return to service engine check.

4. The operational flight phase determination, indication and configuration system of claim 1 wherein said operational mode signal provides an operational mode defined by the manufacturer or operator.

5. The operational flight phase determination, indication and configuration system of claim 1 wherein said processor operates to implement the steps comprising:
   a) reading said flight phase data table;
   b) reading in said aircraft system configuration data table;
   c) reading said flight phase transition rules table;
   d) reading said aircraft sensor signals;
   e) reading said operational flight phase selector output signal;
   f) reading said on-board automation system output signals;
   g) determining from said read flight phase data table, said read aircraft system configuration data table, said read flight phase transition rules table, said aircraft sensor signals, and said operational flight phase selector output signal whether the aircraft is on the ground;

h) computing said flight phase from said read flight phase data table, said read flight phase transition rules table, said aircraft sensor signals, and said operational flight phase selector output signal, thus providing said operational mode signal;

i) computing said aircraft configuration from said read aircraft system configuration data table, said read on-board automation system output signals, and said operational mode signal, thus providing a configuration command signal;

j) providing said operational mode signal to a flight phase indicator;

k) providing said configuration command signal to an aircraft system; and, l) repeating steps d) through j).

6. The operational flight phase determination, indication and configuration system of claim 5 further including a step, between step k) and l), above, of using said aircraft sensor signals and said on-board automation system output signals to confirm the aircraft system is properly configured in accordance with said configuration command signal.

7. The operational flight phase determination, indication and configuration system of claim 1 wherein said processor operates to implement the step of computing said flight phase, by the steps of:
   a) obtaining said list of defined operational flight phases from said flight phase data table;
   b) obtaining said flight rules from said flight phase transition rules set;
   c) determining whether a flight phase transition is occurring by obtaining said aircraft sensor signals, said operational flight phase selector output signal, and on-board automation system output signals as inputs from said input/output circuitry;
   d) determining the initial operational state by applying said flight rules based on said inputs; and,
   e) monitoring said inputs and transitioning to the next operational state when said transition rules are satisfied by said inputs.

8. The operational flight phase determination, indication and configuration system of claim 1 further comprising an operational flight phase selector selecting a desired flight phase and providing said operational flight phase selector output signal in response to said selection.

9. The operational flight phase determination, indication and configuration system of claim 1 further comprising an operational flight phase indicator for receiving said display indicator driver signals and providing an indication of the active operational flight phase.

10. The operational flight phase determination, indication and configuration system of claim 1 wherein said configuration commands are implemented according to the interface requirements of the airplane systems being commanded.

11. The operational flight phase determination, indication and configuration system of claim 1 wherein when an aircraft system is not capable of responding to said configuration command signal, said configuration command is displayed on said operational flight phase indicator for manual setting thereof.

12. A method for determining, indicating, and configuring an operational flight phase of an aircraft, comprising:
   a) receiving an operational flight phase selector output signal, aircraft sensor signals, and on-board automation system output signals including configuration status information, utilizing input/output circuitry;
   b) providing an operational mode signal indicating the operational mode of the aircraft and a configuration command signal, utilizing a processor, using input from said input/output circuitry, a flight phase data table, a flight phase transition rules set, an aircraft system configuration data table, program memory and working memory, wherein, said flight phase data table includes a list of the defined operational flight phases for the aircraft, said flight phase transition rules set include flight rules for defining flight phase transitions, said aircraft system configuration data table includes a list of the defined configurations for each operational flight phase and the aircraft system configuration settings for each said configuration;
   c) providing display indicator driver signals in accordance with said operational mode signal;
   d) providing a plurality of output drivers coupled to said processor for providing configuration commands to aircraft systems in accordance with said configuration command signal;
   e) displaying the active operational flight phase of the aircraft in response to said display indicator driver signals; and,
   f) configuring aircraft systems in response to said configuration command signal.

13. The method of claim 12 wherein said processor operates to implement the steps, comprising:
   a) reading said flight phase data table;
   b) reading in said aircraft system configuration data table;
   c) reading said flight phase transition rules table;
   d) reading said aircraft sensor signals;
   e) reading said operational flight phase selector output signal;
   f) reading said on-board automation system output signals;
   g) determining from said read flight phase data table, said read aircraft system configuration data table, said read flight phase transition rules table, said aircraft sensor signals, and said operational flight phase selector output signal whether the aircraft is on the ground;
   h) computing said flight phase from said read flight phase data table, said read flight phase transition rules table, said aircraft sensor signals, and said operational flight phase selector output signal, thus providing said operational mode signal;
   i) computing said aircraft configuration from said read aircraft system configuration data table, said read on-board automation system output signals, and said operational mode signal, thus providing a configuration command signal;
   j) providing said operational mode signal to a flight phase indicator;
   k) providing said configuration command signal to an aircraft system; and,
   l) repeating steps d) through j).

14. An aircraft configuration determination system, comprising:
   a) input/output circuitry for receiving a configuration selector output signal; and, on-board automation system output signals including configuration status information;
   b) a processor coupled to said input/output circuitry;
   c) an aircraft system configuration data table coupled to said processor, said aircraft system configuration data table including a list of the defined configurations for each configuration selectable by a configuration selector;
   d) program memory and working memory coupled to said processor, wherein said processor uses input from said input/output circuitry, said program memory, said working memory and said aircraft system configuration data table to provide a configuration mode signal indicating the selected configuration mode of the aircraft and a configuration command signal;

e) a display indicator driver coupled to said processor for providing display indicator driver signals to a configuration indicator in accordance with said configuration mode signal; and, f) a plurality of output drivers coupled to said processor for providing configuration commands to aircraft systems in accordance with said configuration command signal.

15. The operational flight aircraft configuration determination system of claim 14 wherein when an aircraft system is not capable of responding to said configuration command signal, said configuration command is displayed on said configuration indicator for manual setting thereof.

* * * * *